United States Patent [19]

Hunter et al.

[11] 4,354,896
[45] Oct. 19, 1982

[54] FORMATION OF SUBMICRON SUBSTRATE ELEMENT

[75] Inventors: William R. Hunter, Garland; Al F. Tasch, Jr., Richardson; Thomas C. Holloway, Garland, all of Tex.

[73] Assignee: Texas Instruments Incorporated, Dallas, Tex.

[21] Appl. No.: 175,470

[22] Filed: Aug. 5, 1980

[51] Int. Cl.$^3$ ............................................. H01L 21/302
[52] U.S. Cl. ................................... 156/643; 156/655; 156/646; 156/647; 156/652; 156/653; 156/657; 156/659.1; 427/86; 427/93; 427/94; 427/95; 430/314
[58] Field of Search ............... 156/643, 646, 647, 655, 156/653, 652, 657, 659.1; 427/93, 86, 94, 95; 430/314

[56] References Cited

U.S. PATENT DOCUMENTS 3,977,925  8/1976  Schwabe ............................. 156/647
4,256,514  3/1981  Pogge .................................. 156/657

OTHER PUBLICATIONS

Deines et al., "Process for Realization of Submicron Geometrics", IBM TDB, vol. 21, No. 9, Feb. 1979, pp. 3628-3629.
Jackson et al., "A Novel Submicron Fabrication Technique", International Electronic Device Meeting Technical Abstracts, Dec. 1-3, 1979, Washington, DC.
Jelks et al., "A Simple Method for Fabricating Lines of 0.15-$\mu$ Width Using Optical Lithography", Appl. Phys. Lett. 34 (1), Jan. 1979, pp. 28-30.
Hosack, "Minimum Geometry Etch Windows to a Polysilicon Surface", IEEE Transactions on Electron Devices, vol. EO-25, No. 1, Jan. 1978, pp. 67-69.
Ipri, "Sub-Micron Polysilicon Gate CMOS/SOS Technology", International Electronic Device Meeting Technical Abstracts, Dec. 4-6, 1978, Washington, DC, pp. 46-49.
Coe, "The Lateral Diffusion of Boron in Polycrystalline Silicon and Its Influence on the Fabrication of Sub-Micron MOSTS", Solid State Electronics, vol. 20, pp. 985-992, 1977.
Kim, "A Very Small Schottky Barrier Diode (SBD) with Self-Aligned Guard Ring for VLSI Applications", Technical Digest of 1979 International Electronic Device Meeting, pp. 49-53.

*Primary Examiner*—John D. Smith
*Attorney, Agent, or Firm*—Thomas E. Tyson; Richard Donaldson; Melvin Sharp

[57] ABSTRACT

A method for patterning a submicrometer substrate element which is smaller than the reproducible resolution accuracy of optical lithography. A series of layers is deposited upon a top layer pattern using standard methods. An edge of the top layer is positioned at or near where the required submicrometer element is to be patterned. A cavity is formed in one of the intermediate layers by removing that intermediate layer in such a fashion that the layer underneath the edge of the top layer is removed. Next, a conformal layer is deposited upon the structure so that the conformal layer fills the cavity. Then the conformal layer is removed and each of the other layers is sequentially removed in such a fashion that only that portion of the conformal layer that occupied the cavity remains, together with any layers that occupy the space underneath the cavity. The remaining layers are the mask for further patterning.

22 Claims, 12 Drawing Figures

FORMATION OF SUBMICRON SUBSTRATE ELEMENT

BACKGROUND OF THE INVENTION

This invention is directed to the patterning of thin film material, and more particularly to patterning such material on the surface of substrate material with a line width less than a micrometer.

Recently an active area in semiconductor fabrication research has been the generation and application of fine lines, or more particularly of fine lines with line widths less than a micrometer. The use of conventional photolithography to attain line widths less than a micrometer has not been successful. Other techniques have been developed using electron beam and X-Ray lithography. While these two techniques have been successful in producing good quality line widths less than a micrometer, the equipment to implement these techniques is quite costly. Consequently, other alternative techniques have been suggested for the production of submicrometer lines.

One such technique uses conventional photolithography and selective edge plating. This technique comprises the use of two layers of metal on the substrate. The top layer is copper and the second layer is chromium. Conventional photolithography is used to produce an edge on the top layer of copper. Gold is then deposited in such a manner that it plates to the edge of the copper layer forming an edge mask. Then the copper layer is removed leaving the gold edge mask on the chromium. The chromium is then selectively removed using plasma etching leaving only the chromium under the gold as an etch mask for further substrate etching. By controlling the plating voltages and other conditions, the width of the gold edge mask is controlled. A similar method using this plating technique involves the use of the copper and chromium layers as before. The copper edge is formed using conventional photolithography but instead of edge plating, immersion plating is issued which results in a one-for-one replacement of the copper atoms with the gold atoms at the edge. The resulting gold etch mask is located in the edge of the copper. See for example a paper by T. N. Jackson and N. A. Masnari entitled "A Novel Submicron Fabrication Technique" published in the International Electronic Device Meeting Technical Abstracts (meeting was held Dec. 1-3, 1979 in Washington, D. C.).

Another technique that has been used to produce submicrometer lines involves a single mask edge etch process. This process requires a single mask layer with an edge so that the mask layer partially covers the substrate. Adjacent to the mask edge and on top of the substrate a passivation layer is deposited. The edge of the mask material is then etched to produce an opening between the passivation layer and the mask layer exposing the substrate. See for example a paper by H. Hosack entitled "Minimum Geometry Etch Windows to a Polysilicon Surface" published in IEEE Transactions on Electron Devices, Vol E025, No. 1, January 1978, page 67.

A different technique for producing submicrometer lines uses a lateral diffusion process. The substrate is covered sequentially with layers of silicon dioxide, polysilicon, silicon nitride and silicon dioxide. The top oxide layer is removed and a portion of the nitride and polysilicon layers are removed in order to form an edge of the nitride and polysilicon layers. Boron is then laterally diffused into the polysilicon. The top nitride layer and undiffused polysilicon are removed. The diffused polysilicon becomes the etch mask. See for example a paper by D. Coe entitled "The Lateral Diffusion of Boron in Polycrystalline Silicon and Its Influence on the Fabrication of Submicron Mosts" published in Solid State Electronics, Vol. 20, pp 985-992, 1977. As to application of this technique to CMOS and SOS technology see also a paper by A. Ipri entitled "Sub-Micron Polysilicon Gate CMOS/SOS Technology" published in the International Electronic Devices Meeting Technical Abstracts (meeting was held Dec. 4-6, 1978 in Washington, D. C.)

An additional technique for producing submicrometer lines involves the use of a shadow deposition method. This method requires that the substrate be coated with a thin layer of aluminum. Then photolithography is used to define an edge of photoresist. A thin layer of titanium is deposited on the photoresist and exposed aluminum layer at an angle to the substrate plane causing the titanium on the aluminum layer to produce an angled edge close to but not connected to the photoresist. The distance between the titanium edge and the photoresist edge is controlled by the amount of titanium deposited and the angle of the deposit. This resulting opening is used with a plasma etch to remove the exposed portion of aluminum beneath the opening. Titanium is then deposited perpendicular to the substrate such that a small portion of titanium is deposited through the opening directly on the substrate surface. The width of this titanium deposit is defined by the width of the opening. The titanium is the etch mask. See for example a paper by E. Jelks et al entitled "A Simple Method for Fabricating Lines of 0.15 Micrometer Width Using Optical Lithography" published in Applied Physics Letters, Vol. 32, No. 1, January 1979, pp 28-30.

It is an object of this present invention to provide a different technique for producing submicrometer line widths on substrates. The disclosed technique would be used when plating, diffusion, or angle deposition is impractical. The disclosed technique would also be used when a line of less than one micron is desired. The disclosed technique is anticipated to have application in high density MOS/LSI.

SUMMARY OF THE INVENTION

In accordance with the embodiment of this invention, a method for patterning a submicrometer substrate element is disclosed. The first step in this method is to sequentially deposit a plurality of layers on the substrate surface to be patterned. Then a submicrometer cavity laterally extending in one of the intermediate layers is formed by removing a portion of this intermediate layer. A layer of conformal material is then deposited upon the surface of this structure such that the conformal layer fills the cavity that was formed. The last step is the removal of all the remaining portions of the surface layer that are not covered by the conformal layer that occupied the cavity.

BRIEF DESCRIPTION OF THE DRAWINGS

The novel features believed characteristic of this invention are set forth in the appended Claims; however, this invention can be best understood by referencing the following detailed description of the embodiment together with these drawings.

DETAILED DESCRIPTION OF THE INVENTION

Figure 1:
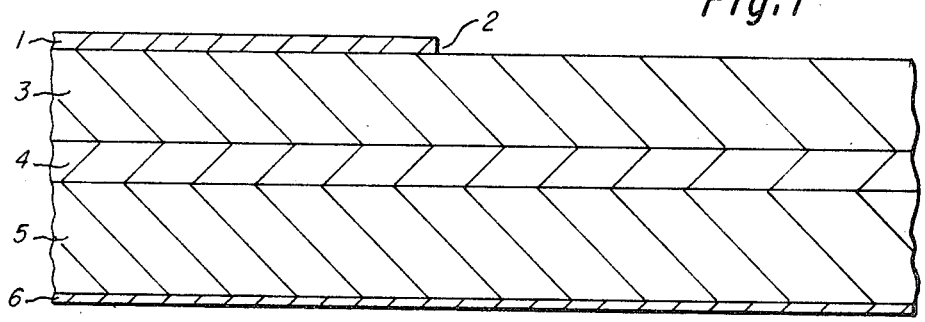
FIG. 1 illustrates three layers on top of the substrate to be patterned.

Referring to FIG. 1, a substrate 5 has been deposited on a layer 6. An embodiment of this invention includes a doped polysilicon layer 5 having a thickness of 4000 A and a silicon dioxide layer 6 having a thickness of 150 A to 250 A. Layer 4 is deposited on top of the substrate. Layer 3 is deposited on layer 4 and layer 1 is deposited on top of layer 3 in such a manner that an edge 2 has formed. Typically, layer 4 is formed by a low pressure chemical vapor deposition of silicon nitride to a thickness of 1400 A. the technique used to form the edge 2 is a standard photolithographic technique. A photoresist is applied to layer 1; the photoresist in layer 1 is then exposed through a mask. The exposed photoresist is then removed. The unexposed photoresist acts as a pattern mask.

In the specific embodiment layer 1 is silicon nitride and can be removed by an etch that attacks silicon nitride leaving the remaining edge 2. Such an etch is a combination of Argon and $CF_4$. This etch is isotropic and is applied for such a time as to allow a 20% to 30% overetch of the silicon nitride layer. Since the etch removes silicon nitride at a rate of 2 or 3 times the rate the etch removes silicon dioxide, the 20% to 30% overetch of the silicon nitride layer will not result in any significant removal of the silicon dioxide layer 3. The remaining photoresist is removed.

Figure 2:
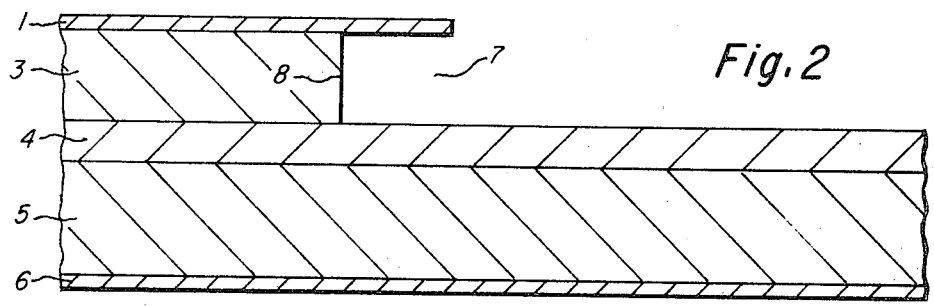
FIG. 2 illustrates the creation of the cavity in an intermediate layer.

FIG. 2 illustrates the forming of cavity 7 by the removal of the intermediate layer 3. In the specific embodiment, layer 3 is a silicon dioxide. The silicon dioxide layer 3 can be partially removed by use of an etch that leaves edge 8. Layer 1 acts as an overhang. In the preferred embodiment, a plasma etch comprised of a mixture of fluorocarbons adjusted to achieve a satisfactory carbon to fluorine ratio is used to anisotropically etch approximately 50% to 80% of the silicon dioxide thickness. This plasma etch will enable the next silicon dioxide etching process to produce a vertical edge 8. Then a controlled wet silicon dioxide etch is used. The amount of silicon dioxide removed is determined by the composition of the etch, the temperature of the etch while deposited on the surface of the substrate and the time the etch is in contact with the substrate. If a diluted hydrogen fluoride or buffered hydrogen fluoride etch (such as Bell 2) is used, the etch rate at room temperature is approximately 600 A per minute. The composition, temperature, and time are controlled to produce an undercut in layer 3 underneath layer 1 of the desired cavity lateral dimension. Layer 4 of silicon nitride, the polysilicon substrate 5, and layer 6 is not affected by this process.

Figure 3:
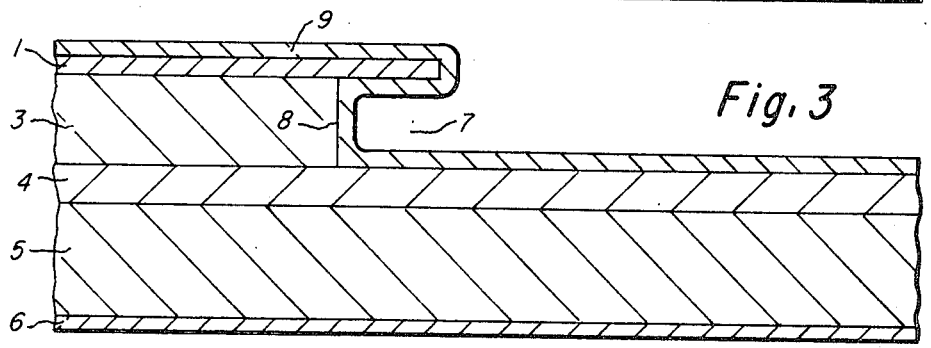
FIG. 3 represents the initial deposition of the conformal layer.

In FIG. 3, a conformal layer 9 is deposited on the structure. Desirable characteristics of a material for the conformal layer are that it should adhere to the surface that it is deposited upon and that it should be removable. For example, any material that can be deposited in a chemical vapor deposition is useful. An embodiment of this invention includes the step of forming the conformal layer by the low pressure chemical vapor deposition of polysilicon. The polysilicon is applied in such a way that it begins to fill the cavity 7 and adheres to the total surface of the structure, even the undercut edge 8 of the intermediate layer 3. In the preferred embodiment, the polysilicon conformal layer is deposited to a thickness of 5% to 10% greater than one-half of the silicon dioxide thickness of layer 3. Layer 1 and layer 4 are completely covered. Layers 5 and 6 are unaffected. Another embodiment of this invention includes the step of forming the conformal layer by the low pressure chemical vapor deposition of silicon nitride.

Figure 4:
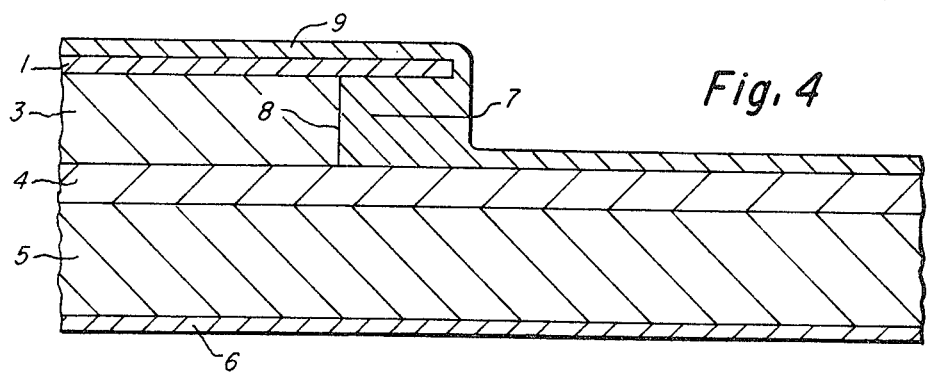
FIG. 4 represents the completed deposition of the conformal layer.

Referring now to FIG. 4, the deposition of the conformal layer 9 has now been completed. Layer 1 and layer 4 are covered. The cavity 7 is completely filled and the conformal material adheres to the edge 8 of layer 3. Layers 5 and 6 are unaffected.

Figure 5:
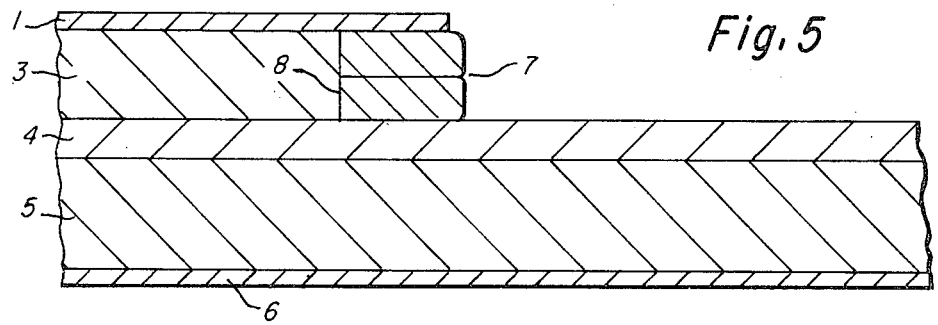
FIG. 5 represents the remaining conformal layer occupying the cavity.

In FIG. 5, the conformal layer has been removed except that which occupies cavity 7. A typical means for removing a conformal layer is the use of a dry anisotropic etch. In a specific embodiment where the conformal layer is polysilicon, the use of a dry anisotropic etch that attacks polysilicon produces the desired results leaving layers 1, 3, 4, 5, and 6 unaffected. Typically this etch includes a mixture of $CCl_4$ and $HCl$. The etch is applied for such a time as to allow a 30% overetch of the polysilicon conformal layer. Since the etching ratio between polysilicon and silicon dioxide or silicon nitride is 10 to 1, no significant removal of the silicon nitride or silicon oxide layers occurs. The remaining polysilicon located in the cavity 7 is still be adjacent to edge 8.

Figure 6:
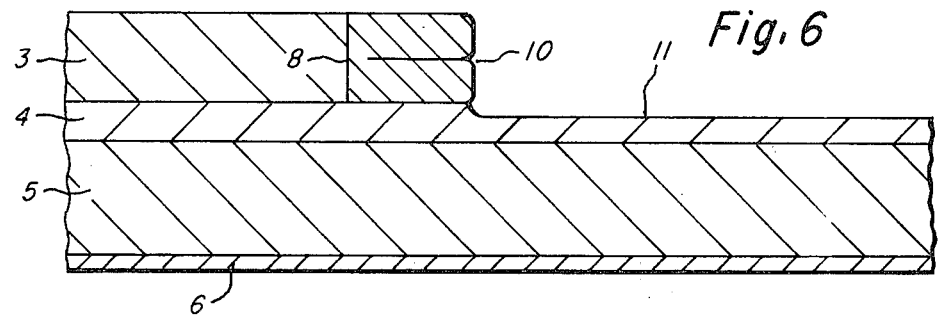
FIG. 6 represents the removal of the top layer.

Referring to FIG. 6, the top silicon nitride layer is removed. This is accomplished for example by means of an etch that attacks silicon nitride, such as, a dry anisotropic etch that is selective against polysilicon. Such an anisotropic etch is a mixture of fluorocarbons adjusted to achieve a satisfactory carbon to fluorine ratio. The etch is applied for such a time as to allow a 30% overetch of the silicon nitride layer 1. The etching ratio between silicon nitride and polysilicon is 4 to 1 so there is no significant removal of the polysilicon occupying the cavity. In removing the top layer, the remaining layers are unaffected except for layer 4. In that case, the exposed portion of layer 4, area 11, is also removed partially. The cavity area is still filled with the conformal layer 10 against edge 8 of the intermediate layer 3. Layers 5 and 6 are unaffected. In a specific embodiment where the conformal layer is silicon nitride, the etch used is a mixture of fluorocarbons adjusted to achieve a satisfactory carbon to fluorine ratio. The etch is applied for sufficient time to remove the exposed conformal layer and the top silicon nitride layer 1. Since the silicon nitride layer 4 is more than double the thickness of layer 1, any overetching of the surface conformal silicon nitride layer and the silicon nitride layer 1 has a minimal effect on layer 4. The conformal layer occupying the cavity has 1.5 times the thickness of the surface conformal layer and silicon nitride layer 1, thus a controlled etch time prevents any significant removal of the conformal layer occupying the cavity.

Figure 7:
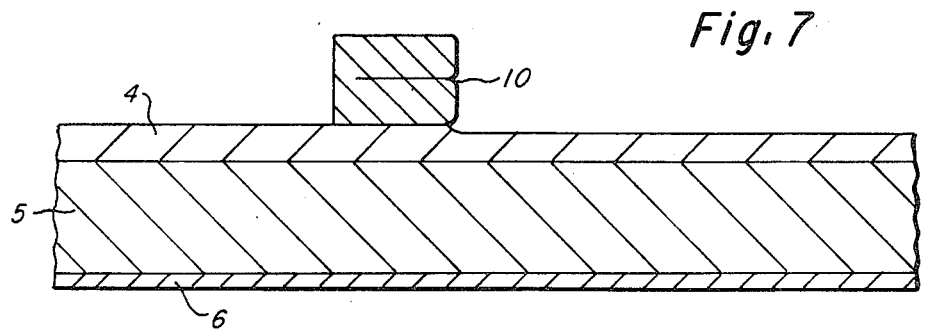
FIG. 7 illustrates the removal of an intermediate layer leaving the conformal layer that occupied the cavity.

Referring to FIG. 7, the layer adjacent to the conformal material 10 has been removed. This is accomplished for example, by an etch that attacks that material. Where this layer is silicon dioxide, the use of a buffered hydrogen fluoride etch yields the desired results, leaving the conformal material 10. In the preferred embodiment, the etch is applied for such a time as to allow a 30% overetch. The conformal material 10 has been formed into a pattern mask whose lateral dimension was determined by the amount of layer 3 that was undercut. The use of the etch to remove the intermediate layer will not further affect layers 4, 5 and 6.

Figure 8:
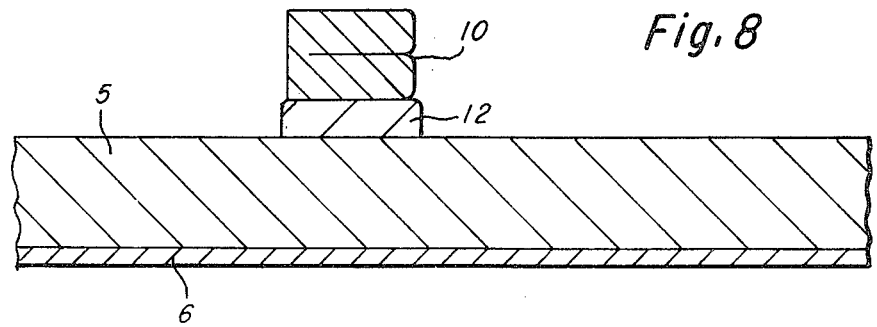
FIG. 8 illustrates the remaining conformal layer as a pattern mask for the patterning of the bottom layer.

Referring now to FIG. 8, the topmost layer, except that underneath the conformal layer, has been removed by use of an anisotropic etch. This remaining portion of the layer 12 has been masked from the etch by conformal layer 10. In the specific embodiment, the layer underneath the conformal material is silicon nitride. Therefore the use of an anisotropic etch that attacks silicon nitride will give the desired results. Again such an anisotropic etch is a mixture of fluorocarbons adjusted to achieve a satisfactory carbon to fluorine ratio. Also the 4 to 1 etching ratio of silicon nitride to polysilicon allows a 30% to 40% overetch of the silicon nitride layer. Layers 5 and 6 will be unaffected.

Figure 9:
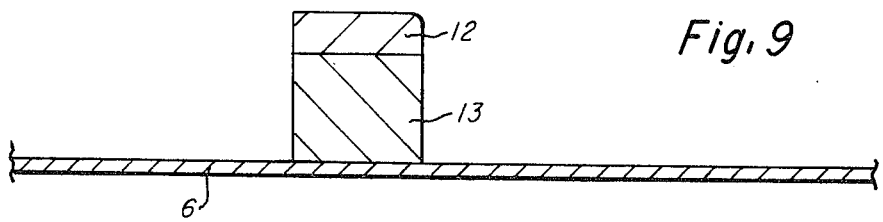
FIG. 9 illustrates the completed patterning of the substrate.

Referring now to FIG. 9, in the embodiment of this invention where the conformal layer is polysilicon and the substrate is doped polysilicon, the removal of the conformal layer by an anisotropic etch that attacks polysilicon but not the patterned silicon nitride layer 12 will result in the formation of the substrate 13, underneath the layer of nitride 12 which has not been affected by the etch. Typically, this etch is a mixture of CCl$_4$ and HCl applied to accomplish a 30% overetch. Layer 6 is not affected. The lateral dimension of the doped polysilicon layer 13 is determined by the width of the conformal layer that was deposited on top of layer 12.

Referring back now to FIG. 2, the width of the conformal layer that has been deposited is determined by cavity 7 which in turn was determined by the amount of layer 3 that was undercut.

Figure 10:
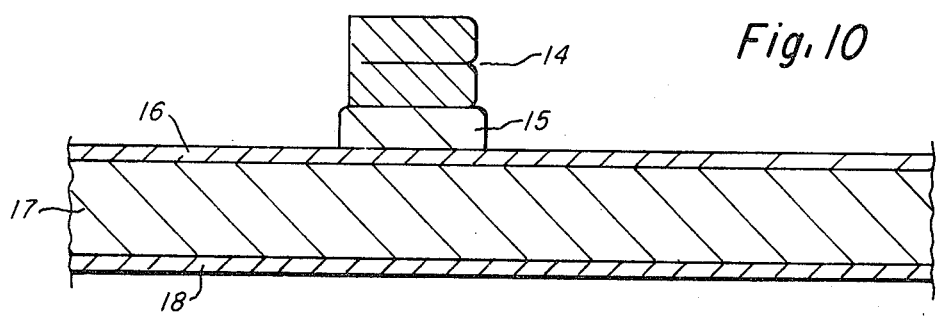
FIG. 10 illustrates a second embodiment wherein an additional layer has been deposited upon the substrate.

A second embodiment of this invention is illustrated in FIG. 10. In FIG. 10, layer 16 is an additional layer of silicon dioxide that was added on top of the substrate 17 to be patterned and underneath the layer 15 of silicon nitride. FIG. 10 illustrates the state of the structure after the removal of all the layer 15 with the exception of that portion underneath the conformal material 14 as previously discussed.

Figure 11:
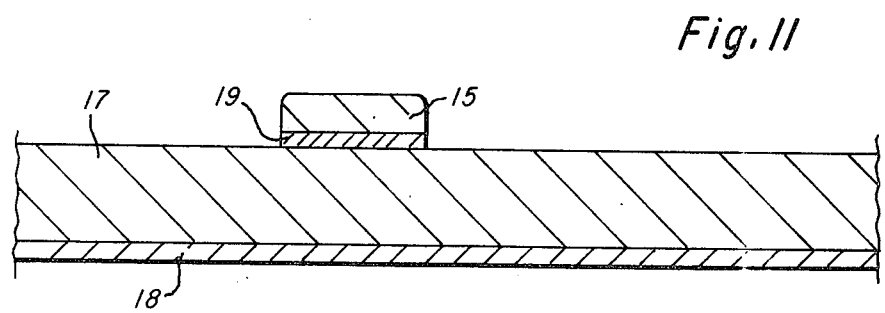
FIG. 11 represents the patterning of this additional layer.

Referring now to FIG. 11, layer 19 has been removed except that which is under layer 15. The remaining portion 19 has been masked from the etch by layer 15. Layers 17 and 18 are unaffected. In the second embodiment where the layer 19 is silicon dioxide, the use of an ethylenediamine-pyrocatechol and water mixture is used to remove the polysilicon conformal material. Then an anisotropic dry etch that attacks silicon dioxide is used to remove all of layer 19 except that which is under the remaining layer 15. A typical etch is a mixture of fluorocarbons adjusted to achieve a satisfactory carbon to fluorine ratio.

Figure 12:
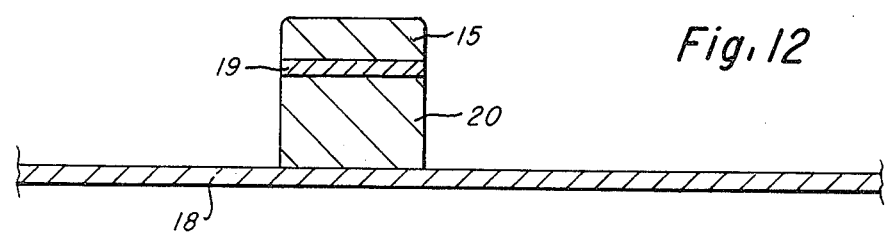
FIG. 12 represents the patterning of the substrate for the second embodiment.

Referring to FIG. 12, in the second embodiment where layer 20 is polysilicon, the use of an etch that attacks polysilicon in an anisotropic manner results in the removal of all of layer 20 except for that portion underneath layers 19 and 15. In this embodiment, layers 19 and 15 act as a pattern mask for the patterning of layer 20. The lateral dimension of layers 19 and 15 are determined by the lateral dimension of the cavity created in the earlier steps.

What is claimed is:

1. A method for patterning a submicrometer substrate element which comprises:
    (a) sequentially depositing a plurality of layers on the substrate surface;
    (b) forming a laterally extending submicrometer cavity by selectively removing an intermediate portion of said surface layers;
    (c) depositing a conformal layer of a material which fills said cavity; and
    (d) removing remaining portions of said surface layers and substrate material not covered by remaining conformal layer.

2. The method as defined by claim 1, wherein said plurality of layers comprises a layer of nitride, a layer of oxide, and a layer of nitride.

3. The method as defined by claim 1, wherein said cavity is formed by:
    (i) patterning the top layer to form an edge; and
    (ii) selectively removing a portion of an intermediate layer located beneath said top layer.

4. The method as defined by claim 3, wherein said edge is formed by use of a selective anisotropic etch.

5. The method as defined by claim 3, wherein said portion of the intermediate layer is removed by means of an etch.

6. The method as defined by claim 5, wherein said etch comprises a wet etch whose etching properties are controlled to attack the said intermediate layer at a rate substantially greater than the other layers.

7. The method as defined by claim 1, wherein said depositing of said conformal layer in said cavity is accomplished by chemical vapor deposition.

8. The method as defined by claim 1 wherein said step of selectively removing said conformal layer is accomplished by means of an etch.

9. The method as defined by claim 1, wherein said step of removing said surface layers is accomplished by means of an etch.

10. A method for patterning a submicrometer substrate element which comprises:
    (a) sequentially depositing a plurality of layers on the substrate surface and patterning the top layer to form an edge;
    (b) forming a laterally extending submicrometer cavity by selectively removing a portion of one of said surface layers beneath said edge;
    (c) depositing a conformal layer of a material which fills said cavity; and
    (d) selectively removing
        (i) said conformal layer except in said cavity and
        (ii) said surface layers except that covered by the remaining conformal layer.

11. The method as defined by claim 10, wherein said plurality of layers comprises a layer of nitride, a layer of oxide, and a layer of nitride.

12. The method as defined by claim 10, wherein said edge is formed by use of a selective anisotropic etch.

13. The method as defined by claim 10 wherein said step of removing a portion of one of said surface layers is accomplished by means of an etch.

14. The method as defined by claim 13, wherein said etch comprises a wet etch whose etching properties are controlled to attack the said intermediate layer at a rate substantially greater than the other layers.

15. The method as defined by claim 10 wherein said depositing of said conformal layer in said cavity is accomplished by chemical vapor deposition.

16. The method as defined by claim 10, wherein said step of selectively removing said conformal layer is accomplished by means of an etch.

17. The method as defined by claim 10 wherein said step of removing said surface layers is accomplished by means of an etch.

18. A method for patterning a submicrometer polysilicon element which comprises:
 (a) sequentially depositing bottom layer of nitride, a layer of oxide, and a top layer of nitride on top of the polysilicon to be patterned;
 (b) patterning the top nitride layer to form an edge positioned where the submicrometer polysilicon element is to be formed;
 (c) selectively removing a portion of the oxide layer so that a submicrometer cavity is formed beneath said edge of the top nitride layer;
 (d) depositing a conformal layer of polysilicon on the resulting composite so that the polysilicon fills said cavity and covers the remaining exposed areas;
 (e) subjecting the conformal polysilicon layer to an anisotropic etch so that only the exposed polysilicon is removed, leaving said cavity filled;
 (f) selectively removing the top nitride layer;
 (g) removing the oxide layer;
 (h) selectively removing the exposed portions of the bottom nitride layer with an anisotropic etch so that only the nitride underneath the remaining conformal polysilicon remains; and
 (i) subjecting remaining structure to a selective, anisotropic etch so that only the exposed polysilicon is removed, leaving the polysilicon underneath the nitride as said submicrometer element to be formed.

19. The method as defined by claim 18, wherein said step of selectively removing a portion of the oxide layer is accomplished by contact with a wet etch whose etching properties are controlled to attack oxide at a rate substantially greater than nitride.

20. A method for patterning a submicrometer polysilicon element which comprises:
 (a) sequentially depositing bottom layer of nitride, a layer of oxide, and a top layer of nitride on top of the polysilicon to be patterned;
 (b) patterning the top nitride layer to form an edge positioned where the submicrometer polysilicon element is to be formed;
 (c) selectively removing a portion of the oxide layer so that a submicrometer cavity is formed beneath said edge of the top nitride layer;
 (d) depositing a conformal layer of nitride on the resulting composite so that the conformal nitride fills said cavity and covers the remaining exposed areas;
 (e) subjecting the conformal nitride layer to an anisotropic etch so that only the exposed nitride and top nitride layer are removed, leaving conformal nitride that filled said cavity;
 (f) removing the oxide layer;
 (g) selectively removing the exposed portions of the bottom nitride layer with an anisotropic etch so that only the nitride underneath the remaining conformal nitride remains; and
 (h) subjecting remaining structure to a selective, anisotropic etch so that only the exposed polysilicon is removed, leaving the nitride as said submicrometer element to be formed.

21. The method as defined by claim 20, wherein said step of selectively removing a portion of the oxide layer is accomplished by contact with a wet etch whose etching properties are controlled to attack oxide at a rate substantially greater than nitride.

22. The method as defined by claim 21, wherein said step of depositing a series of layers consists of depositing a series of layers of nitride, oxide, nitride and oxide and said step of removing the polysilicon layer polysilicon layer with an anisotropic etch is preceded by a step wherein the bottom bottom oxide layer is removed by an anisotropic etch selective against polysilicon.

* * * * *